United States Patent
Takano et al.

(10) Patent No.: US 7,335,464 B2
(45) Date of Patent: Feb. 26, 2008

(54) WATER SOLUBLE RESIN COMPOSITION, METHOD OF PATTERN FORMATION AND METHOD OF INSPECTING RESIST PATTERN

(75) Inventors: Yusuke Takano, Kakegawa (JP); Sung-Eun Hong, Kakegawa (JP)

(73) Assignee: AZ Electronic Materials USA Corp., Somerville, NJ (US)

( * ) Notice: Subject to any disclaimer, the term of this patent is extended or adjusted under 35 U.S.C. 154(b) by 209 days.

(21) Appl. No.: 10/546,334

(22) PCT Filed: Feb. 16, 2004

(86) PCT No.: PCT/JP2004/001612

§ 371 (c)(1),
(2), (4) Date: Aug. 18, 2005

(87) PCT Pub. No.: WO2004/074941

PCT Pub. Date: Sep. 2, 2004

(65) Prior Publication Data

US 2006/0160015 A1    Jul. 20, 2006

(30) Foreign Application Priority Data

Feb. 24, 2003  (JP) .............................. 2003-045599

(51) Int. Cl.
G03F 7/039    (2006.01)
G03F 7/40    (2006.01)
(52) U.S. Cl. .................. 430/327; 430/270.1; 430/324; 430/328; 430/914; 430/964
(58) Field of Classification Search ............. 430/270.1, 430/324, 327, 328, 964, 914
See application file for complete search history.

(56) References Cited

U.S. PATENT DOCUMENTS 3,104,205 A     9/1963    Hainer et al.

(Continued)

FOREIGN PATENT DOCUMENTS

EP    1 223 470 A1    7/2002

(Continued)

OTHER PUBLICATIONS

English Language Abstract of JP 10-158328 A, Jun. 1995.

(Continued)

Primary Examiner—Richard L. Schilling
(74) Attorney, Agent, or Firm—Sangya Jain

(57) ABSTRACT

A water-soluble resin composition of the present invention comprises at least a water-soluble resin, an acid generator capable of generating an acid by heating and a solvent containing water. The water-soluble resin composition is applied on a highly water-repellant resist pattern 3 formed by a resist such as an ArF-responsive radiation sensitive resin composition on a substrate 1 to form a coated layer 4 thereon. The resist pattern 3 and the coated layer 4 are heat-treated to form a developer-insoluble modified coated layer 5 in the vicinity of a surface of the resist pattern 3. The coated layer is developed and the resist pattern thickened by the modified layer 5 is formed. The modified layer is a layer with sufficient thickness and is able to be formed with a high dimensional controllability in a highly water-repellant resist pattern such as ArF-responsive radiation sensitive resin composition. As a result, a separation size and a hole aperture size of the resist pattern are reduced effectively to less than a limit resolution. As the modified layer 5 has a function of a protecting film for the resist pattern upon electron beam irradiation, a size measurement fluctuation of a resist pattern upon electron beam irradiation by a size measuring SEM can be prevented.

13 Claims, 2 Drawing Sheets

U.S. PATENT DOCUMENTS

| | | |
|---|---|---|
| 3,666,473 A | 5/1972 | Colom et al. |
| 4,812,551 A | 3/1989 | Oi et al. |
| 5,035,881 A | 7/1991 | Mori et al. |
| 5,294,444 A | 3/1994 | Nakamura et al. |
| 5,538,820 A | 7/1996 | Fisher |
| 5,547,812 A | 8/1996 | Collins et al. |
| 5,585,219 A | 12/1996 | Kaimoto et al. |
| 5,820,491 A | 10/1998 | Hatch et al. |
| 5,843,624 A | 12/1998 | Houlihan et al. |
| 5,858,620 A | 1/1999 | Ishibashi et al. |
| 5,863,707 A | 1/1999 | Liu |
| 6,080,707 A | 6/2000 | Glenn et al. |
| 6,090,772 A | 7/2000 | Kaiser et al. |
| 6,147,249 A | 11/2000 | Watanabe et al. |
| 6,180,244 B1 | 1/2001 | Rayner et al. |
| 6,274,286 B1 | 8/2001 | Hatakeyama et al. |
| 6,319,853 B1 | 11/2001 | Ishibashi et al. |
| 6,365,332 B1 | 4/2002 | Price et al. |
| 6,447,980 B1 | 9/2002 | Rahman et al. |
| 6,555,607 B1 | 4/2003 | Kanda et al. |
| 6,579,657 B1 | 6/2003 | Ishibashi et al. |
| 6,811,817 B2 | 11/2004 | Sugeta et al. |
| 7,141,177 B2 | 11/2006 | Tanaka |
| 7,226,726 B2 | 6/2007 | Kanda |
| 2001/0044070 A1 | 11/2001 | Uetani et al. |
| 2002/0192591 A1 | 12/2002 | Komatsu et al. |
| 2003/0008968 A1 | 1/2003 | Sugeta et al. |
| 2003/0091732 A1 | 5/2003 | Kanda |
| 2003/0102285 A1 | 6/2003 | Nozald et al. |
| 2003/0129538 A1 | 7/2003 | Shen et al. |
| 2004/0121259 A1 | 6/2004 | Kozawa et al. |
| 2006/0160015 A1 | 7/2006 | Takano et al. |
| 2006/0183218 A1 | 8/2006 | Takahashi et al. |
| 2006/0211814 A1 | 9/2006 | Nishikawa et al. |
| 2007/0059644 A1 | 3/2007 | Takahashi et al. |

FOREIGN PATENT DOCUMENTS

| | | |
|---|---|---|
| EP | 1 273 974 A2 | 1/2003 |
| JP | 61-173376 | 10/1986 |
| JP | 5-241348 | 9/1993 |
| JP | 6-250379 | 9/1994 |
| JP | 10-158328 A | 6/1998 |
| JP | 2001-228616 | 8/2001 |
| JP | 2001-304841 | 10/2001 |
| JP | 2003-140363 | 5/2003 |

OTHER PUBLICATIONS

Machine Language English Translation from JPO of JP 10-158238 A, Jun. 1998.

Office Action date mailed May 16, 2007 for U.S. Appl. No. 10/557,926, May 2007.

English Language abstract of JP 5-241348, 1993.

English Language abstract of JP 6-250379, 1994.

English Language abstract of JP 61-173376, 1986.

English Language abstract of JP 2001-228616, 2001.

English Language abstract of JP 2003-140363, 2003.

US 7,335,464 B2

WATER SOLUBLE RESIN COMPOSITION, METHOD OF PATTERN FORMATION AND METHOD OF INSPECTING RESIST PATTERN

TECHNICAL FIELD OF THE INVENTION

The present invention relates to a resist pattern forming method by which a separation size or a hole aperture size of the resist pattern is reduced practically and effectively below a limit resolution by forming a coated layer on a resist pattern by use of a water-soluble resin composition, then forming a modified layer which is insoluble in a developer on the surface of the resist pattern by modifying the coated layer adjoining the resist pattern, and thereby thickening the resist pattern upon formation of a resist pattern in a semiconductor manufacturing process; a method of reducing a dimensional fluctuation of a resist pattern that occurs upon electron beam irradiation of a size measuring SEM by said modified layer; an improved inspection method of a size measurement of a resist pattern using a size measuring SEM; and a water-soluble resin composition used for these methods favorably and suitably.

BACKGROUND ART

In the various fields such as a manufacture of semiconductor device such like an LSI, a preparation of a flat panel display (FPD) such like a liquid crystal display (LCD) panel, a manufacture of a circuit substrate such like a thermal head and so on, photolithography technology has so far been employed for forming microelements or for conducting fine processing. In the photolithography technology, a positive or negative-working photosensitive resin composition (photoresist) is used to form a resist pattern. These positive or negative-working photoresists are applied on a substrate, mask-adjusted, exposed to light and developed to form a resist pattern. The thus-formed resist patterns are put to use as an etching resist and a resist applied upon impurity ion implantation in manufacturing of, for example, a semiconductor device, an FPD and a circuit substrate or as a plating resist and so on in manufacturing of a magnetic head, and so on.

In these years, as a semiconductor device is becoming highly integrated, wiring required in production process and an element separation width thereof are fined more and more. In order to respond to the situation, a various kind of trials have been being made such as conducting a micronization of resist pattern by utilizing a light with a shorter wavelength, forming a finer resist pattern using a phase shift reticle and so on, development of a new resist to meet these requirements, a development of a novel process, etc. However there are problems that it is difficult to form a fine pattern exceeding a limit of wavelength of light-exposure wavelength by the lithography technology utilizing exposure light so far applied and on the other hand, the price of a device for a short wavelength or a device applying a phase shift reticle etc is high. As one of the methods to solve those problems, a following fine pattern forming method has been proposed wherein a positive or negative-working photoresist so far publicly known is used as a photoresist. That is, after forming a resist pattern by the pattern forming method so far publicly known, an acid-crosslinkable material layer for forming a coated layer is formed on the thus-formed resist pattern. The material layer is then crosslinked and hardened utilizing diffusion of an acid from the resist pattern by heating to be made insoluble in a developer. Thereafter the resist pattern is thickened by removing unhardened area by development to conduct a fining of the resist pattern by narrowing a width between a resist pattern and a neighboring other resist pattern, and as a result a fine resist pattern below a limit resolution of light-exposure wavelength is formed practically and effectively (Following Patent Literature 1, Patent Literature 2 and Patent Literature 3 are to be referred, for example.).

[Patent Literature 1]
Japanese Laid-Open Patent Publication No. Hei 5-241,348

[Patent Literature 2]
Japanese Laid-Open Patent Publication No. Hei 6-250,379

[Patent Literature 3]
Japanese Laid-Open Patent Publication No. Hei 10-73,927

The above-described method is being paid attention to be a useful method as it is not necessary to invest a high price facility such as light-exposure device for a short wavelength and is possible to cut down a dimension of a space area in a resist pattern practically and effectively.

The above-described fine resist pattern forming method so far proposed, wherein a fine resist pattern below a limit resolution of light-exposure wavelength is formed practically and effectively by thickening a resist pattern and narrowing thereby a width between a resist pattern and the other resist pattern, is mainly directed to a resist pattern formed by a KrF resist (KrF responsive radiation sensitive resin composition) and it exhibited the effect towards a KrF resist. Whereas an ArF excimer laser exposure process is proposed in these days aiming at further fining and an ArF resist (ArF responsive radiation sensitive resin composition) is being proposed with it. The KrF resist so far known is required to be transparent to 248 nm light source, whereas the ArF resist is required to be transparent to 193 nm light source. As a result, a polymer having a structure such that a protecting group is introduced into acrylic resin, methacrylic resin or the like is becoming a leading material naturally as the ArF resist. As these protecting groups, an alicyclic protecting group has been proposed, and a hydrophobic property of the polymer itself is getting higher by the introduction of the alicyclic protecting group. On the other hand, a composition for forming a coated layer is a composition comprising a water-soluble resin and water as main components in order not to dissolve a resist pattern film which constitutes the first layer. However a water-soluble resin composition for forming a coated layer so far proposed is not regarded to have a good applying property on a resist pattern of high water repellency such an ArF resist described before. Because of this it is not possible to form a good coated layer. In addition there is a problem that a crosslinked hardened layer having sufficient film thickness is not formed in a coated layer, which is thought to be brought by insufficient acid diffusion from a resist pattern. Besides depending on the kind of polymer contained in an ArF resist, a resist pattern dimension is fluctuated by an electron beam exposure according to a size measuring SEM after forming a resist pattern. Therefore there exists a resist of which it is not possible to conduct an accurate size measurement and it is one of the factors which make a semiconductor manufacturing process difficult.

The present invention was made considering the above described situation. An object of the present invention is to propose a pattern forming method of reducing a separation size or a hole aperture size of a resist pattern below a limit resolution practically and effectively and in a high dimensional controllability, wherein a coated layer is applied on the resist pattern such as an ArF resist pattern which is formed by a way so far applied and has a relatively high water repellency and then modified by heating to form a modified layer which is insoluble in a developer on the surface of the resist pattern and thicken thereby the resist pattern.

Another objects of the present invention are to propose a method of reducing a dimensional fluctuation of the resist pattern caused by an electron beam exposure after a pattern formation, wherein a coated layer is given on a resist pattern such as an ArF resist pattern which is formed by a way so far applied and has a relatively high water repellency and then a modified layer which is insoluble in a developer is formed on the surface of the resist pattern by modification of the coated layer by heating; and an inspection method of a resist pattern by which a dimensional fluctuation caused by irradiation of an electron beam is reduced upon above-described inspection of a size measurement for the resist pattern with a size measuring SEM.

Furthermore another object of the present invention is to propose a water-soluble resin composition which is preferably and suitably used for forming the coated layer in the above-described pattern forming method of reducing a separation size or a hole aperture size of the resist pattern practically and effectively below a limit resolution by thickening the resist pattern, the above-described method of reducing a dimensional fluctuation of is reduced.

DISCLOSURE OF THE INVENTION

As a result of eager studies and examinations, the present inventors found that the above-described various kind of objects can be attained by containing of an acid generator that can generate an acid by heating in the above-described water-soluble resin composition which is a coated layer forming material used for coating the resist pattern and further by making it possible to provide a resist pattern with a resistance to an electron beam when using a particular type of polymer as a water-soluble resin to reach to the present invention.

It means that the present invention relates to a water-soluble resin composition characterized in comprising at least a water-soluble resin, an acid generator that can generate an acid by heating and a solvent containing water.

The present invention also relates to a pattern forming method to reduce a separation size or a hole aperture size of a resist pattern practically and effectively below a limit resolution, which is characterized in comprising a step of forming a coated layer by applying the water-soluble resin composition on a resist pattern, a step of forming a modified layer of the coated layer which is made insoluble in a developer in a determined width on a surface of the resist pattern described before by heating the coated layer described before, and a step of forming a pattern having the modified layer on a surface of the resist pattern by developing the coated layer described before.

The present invention further relates to a method to reduce a dimensional fluctuation of a resist pattern caused by electron beam irradiation, which is characterized in comprising a step of forming a coated layer by applying the water-soluble resin composition described above on a resist pattern, a step of forming a modified layer of the coated layer which is made insoluble in a developer in a determined width on a surface of the resist pattern described before by heating the coated layer described before, and a step of forming a pattern having the modified layer on a surface of the resist pattern by developing the coated layer described before.

The present invention further relates to an inspection method of a resist pattern, which is characterized in comprising a step of forming a coated layer by applying the water-soluble resin composition described above on a resist pattern, a step of forming a modified layer of the coated layer which is made insoluble in a developer in a determined width on a surface of the resist pattern described before by heating the coated layer described before, a step of forming a pattern having the modified layer on a surface of the resist pattern by developing the coated layer described before, and a step of measuring a resist pattern size by an electron beam irradiation to the pattern described before.

BRIEF EXPLANATION OF THE DIAGRAMS

Figure 1:
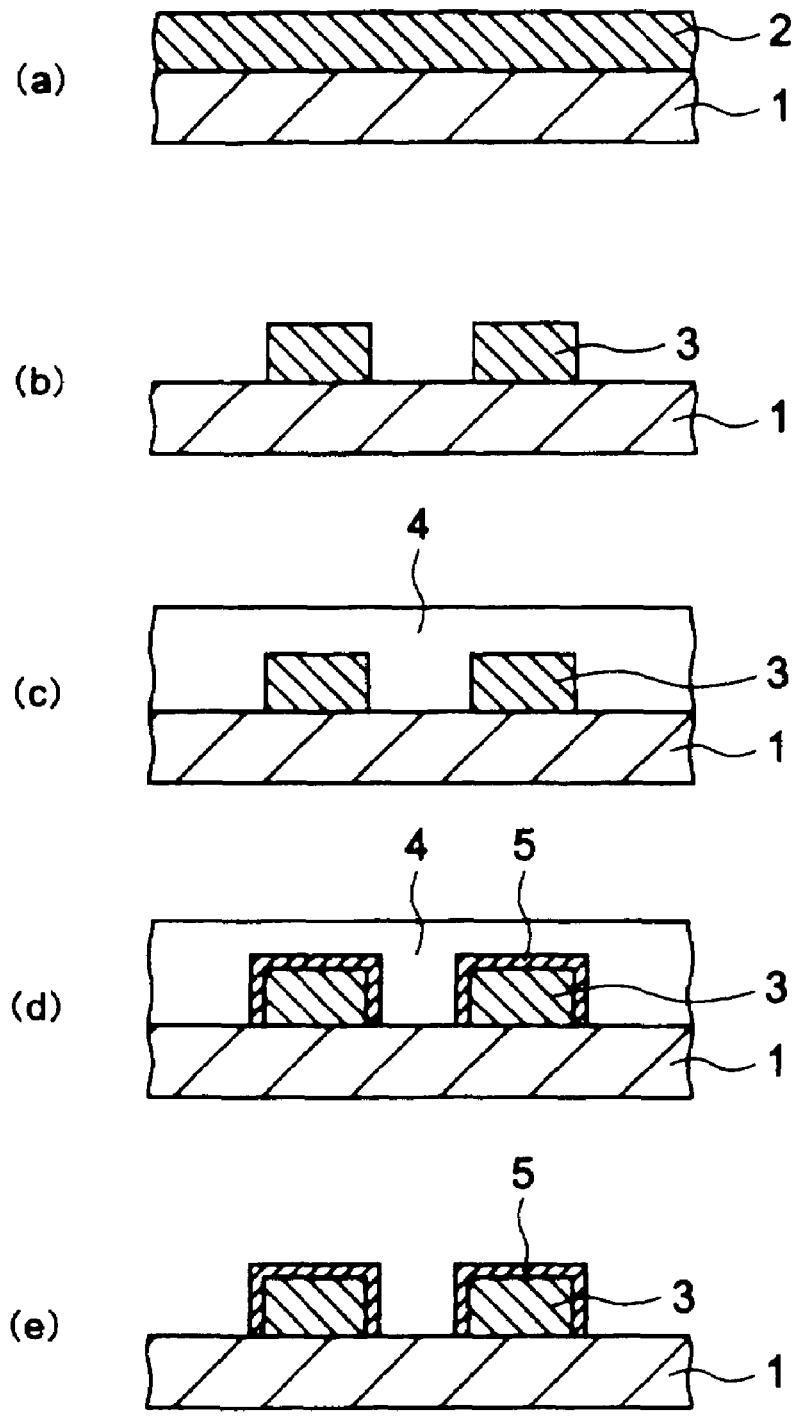
FIG. 1 shows an explanatory diagram explaining a pattern forming process of the present invention.

Hereinafter, the present invention will be further described in more detail on the water-soluble resin composition of the present invention and a pattern forming method using the water-soluble resin composition, a method to reduce the fluctuation of a size measurement value of a resist pattern by irradiation of an electron beam and an inspection method of a resist pattern.

First, the water-soluble resin composition of the present invention will be explained. The water-soluble resin composition of the present invention comprises at least a water-soluble resin, an acid generator that can generate an acid by heating and a solvent containing water. As a water-soluble resin used in the water-soluble resin composition of the present invention, any water-soluble resin so far applied can be used if a solubility of the resin in water is 0.1 weight % or higher. As the water-soluble resin used in the water-soluble resin composition of the present invention, there can be exemplified a homopolymer or a multi-component copolymer of vinyl monomer with a hydrophilic group, and a polycondensated polymer with a hydrophilic group. Examples of these resins include polyvinyl alcohol (including a partially saponified substance), polyacrylic acid, polymethacrylic acid, poly(2-hydroxyethylacrylate), poly(2-hydroxyethyl methacrylate), poly(4-hydroxybutyl acrylate), poly(4-hydroxybutyl methacrylate), poly(glycosiloxyethyl acrylate), poly(glycosiloxyethyl methacrylate), polyvinylmethyl ether, polyvinylpyrrolidone, polyethylene glycol, polyvinyl acetal (including a partially acetalized substance), polyethyleneimine, polyethyleneoxide, a copolymer of styrene and maleic anhydride, polyvinylamine, polyallylamine, a water-soluble resin containing an oxazoline group, a water-soluble melamine resin, a water-soluble urea resin, alkyd resin, sulfonamide or salts thereof. These can be applied singly or a combination of two or more kinds. Of these resins, a copolymer represented by the general formula described below is particularly favorable. This polymer may be either a random copolymer or a block copolymer, however a random copolymer is preferable.

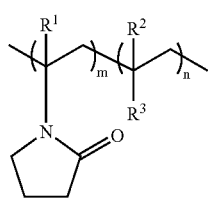

Wherein $R^1$ and $R^2$ each represent independently a hydrogen atom or a methyl group, $R^3$ represents a hydroxyl group, a carboxyl group, —$OCOR^4$ or

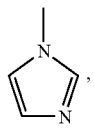

$R^4$ represents an alkyl group and m and n each are a number of 10 to 100,000.

A polymer represented by the general formula (II) described below is also a water-soluble resin which can be preferably applied.

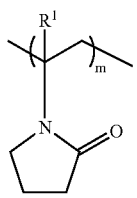

Wherein $R^1$ represents a hydrogen atom or a methyl group and m is a number of 10 to 100,000.

The weight average molecular weight of the water-soluble resin is preferably 1,000 to 1,000,000, more preferably 3,000 to 200,000. When the molecular weight of the resin is less than 1,000, the applicability thereof is deteriorated to be hardly able to obtain a film with a homogeneous quality and simultaneously to reduce a stability of an applied film with the elapse of time. On the other side, when the molecular weight is higher than 1,000,000, a stringy phenomenon is taken place upon the application or spreading on a resist surface becomes worse to be unable to obtain a homogeneous coated film by application with a small dropping amount. Furthermore there is a case where a permeability of a filter is inferior.

In the case where the water-soluble resin composition of the present invention is applied for forming a protecting modified layer in order to control a size measurement fluctuation of a resist pattern caused by an electron beam upon measuring of a resist pattern size by SEM, the water-soluble resin is preferably to be a particular type of polymer showing a determined level of resistance to electron beam irradiation to be generated by a size measuring SEM, for example a polymer having an imidazole group.

As an acid generator able to generate an acid by heating and used in the water-soluble resin composition of the present invention, a compound generating an acid by heating at 70 to 160° C. is preferred and an amine salt of an organic acid is preferred above all although there is no restriction if it may generate an acid by heating and it may be a water-soluble compound. Furthermore as an amine salt of organic acid, an acid generator represented by the general formula described below is preferred.

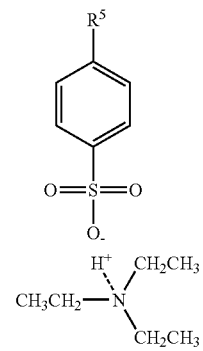

Wherein $R^5$ represents an alkyl group, a hydroxyl group or a carboxyl group.

A surface active agent may be further added into the water-soluble resin composition of the present invention, if necessary. As preferable concrete examples of the surface active agent, although there is no restriction if it may be able to improve an applicability of a water-soluble resin composition, there can be raised Fluorad manufactured by 3M company, Nonypol manufactured by Sanyo Kasei company, Megafac manufactured by Dai-Nippon Ink and Chemicals, Inc., acetylene alcohol such as a compound represented by the general formula (IV) described below for example, acetylene glycol, polyethoxylate of acetylene alcohol, polyethoxylate of acetylene glycol or the like.

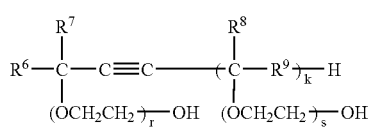

Wherein $R^6$ represents a linear or branched alkyl group having a carbon number of 1 to 20, $R^7$ and $R^8$ each represent independently H or a linear or branched alkyl group having a carbon number of 1 to 3, $R^9$ represents a linear or branched alkylene group having a carbon number of 1 to 20, k is 0 or 1, and r and s each represent independently an integer including 0.)

Among the surface active agents, acetylene alcohol, acetylene glycol, polyethoxylate of acetylene alcohol and polyethoxylate of acetylene glycol are particularly preferred. As acetylene alcohol and acetylene glycol, there are exemplified 3-methyl-1-butyne-3-ol, 3-methyl-1-pentyne-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethy-3-hexyne-2,5-diol, 2,5-dimethyl-2,5-hexanediol and so on. As polyethoxylate of acetylene alcohol and polyethoxylate of acetylene glycol, there are exemplified polyethoxylate of acetylene alcohol or acetylene glycol which is concretely exemplified above. These surface active agents can be applied singly or in a mixture of two or more kinds thereof, the formulated amount thereof is preferably 50 to 2,000 ppm relative to a water-soluble resin composition, more preferably 100 to 1,000 ppm.

The water which is used as a solvent in the water-soluble resin composition of the present invention is not particularly limited if it is water and one from which organic impurities or metal ions are removed by distillation, ion exchange treatment, filter treatment, a various kind of absorption treatments and so on is preferred.

In addition, it is possible to use a water-soluble organic solvent with water aiming at an improvement of applicability and so on. Water-soluble organic solvents are not limited if a solubility thereof in water is 0.1 weight % or higher. As water-soluble organic solvents, there can be exemplified alcohols such as methyl alcohol, ethyl alcohol, isopropyl alcohol and so on; ketones such as acetone, methylethylketone, 2-heptanone, cyclohexanone and so on; esters such as methyl acetate, ethyl acetate and so on; ethylene glycol monoalkyl ethers such as ethylene glycol monomethyl ether, ethylene glycol monoethyl ether and so on; ethylene glycol monoalkyl ether acetates such as ethylene glycol monomethyl ether acetate, ethylene glycol monoethyl ether acetate and so on; propylene glycol monoalkyl ethers such as propylene glycol monomethyl ether, propylene glycol monoethyl ether and so on; propylene glycol monoalkyl ether acetates such as propylene glycol monomethyl ether acetate, propylene glycol monoethyl ether acetate and so on; lactic esters such as methyl lactate, ethyl lactate and so on; aromatic hydrocarbons such as toluene, xylene and so on; amides such as N,N-dimethylacetamide, N-methylpyrrolidone and so on; lactones such as γ-butyrolactone and so on; and the like. Among these solvents, lower alcohols having $C_1$ to $C_4$ such as methyl alcohol, ethyl alcohol, isopropyl alcohol and so on are preferable. These solvents can be used singly or in a mixture of two or more kinds thereof. These solvents can be used in the limit wherein a resist pattern is not solved out by a water-soluble resin composition which contains the solvent.

In the water-soluble resin composition of the present invention, it is preferred that 1 to 30 parts by weight of the water-soluble resin and 0.01 to 10 parts by weight of an acid generator relative to 100 parts by weight of the water-soluble resin composition are contained.

In the following, a method to reduce a separation size or a hole aperture size of the resist pattern practically and effectively below a limit resolution by using the water-soluble resin composition of the present invention, a method to reduce a size measurement fluctuation of a resist pattern caused by electron beam irradiation of size measuring SEM by using the water-soluble resin composition of the present invention, and an inspection method of a size measurement of a resist pattern by using a size measuring SEM are now explained by referring to diagrams if necessary. In the following explanation, the case where a resist pattern is formed by an ArF resist will be raised as an example. However the resist pattern according to each method of the present invention is not limited to the ArF resist pattern.

FIGS. 1(a) to 1(e) show process diagrams to explain a method of forming a developer insoluble modified layer on a surface of an ArF resist pattern by using the water-soluble resin composition of the present invention and in each diagram, a substrate, a photoresist, a resist pattern, a coated layer, a modified layer and so on are shown as a cross section view showing a frame format. First, as shown in FIG. 1(a), an ArF resist (for example, a positive-working chemically amplified resist) is applied on a substrate to be processed such as a semiconductor substrate 1, for example in order to form a photoresist layer 2 thereon. Next, the photoresist layer 2 is exposed to light by using an irradiation device having an ArF excimer laser light source through a photomask which is not diagramed, followed by developing to form a positive-working pattern 3 (see FIG. 1(b)). Then, as shown in FIG. 1(c), a water-soluble resin composition of the present invention is applied as covering this resist layer 3 to form a coated layer 4. Thereafter the resist pattern 3 and the coated layer 4 are heated. An acid generator which generates an acid by heating is contained in the water-soluble resin composition of the present invention, and the coated layer is chemically modified by an acid generated from the acid generator by heating. At this time, an area neighboring to the resist pattern 3 in the coated layer 4 is physically and chemically modified more intensively than other area to form a modified layer 5 which is made insoluble in a developer mentioned later. On the other hand, as a chemical modification does not advance so much on other area of the coated layer, the area is kept in the soluble state in the developer (see FIG. 1(d)). Although the reason why the coated layer neighboring to the resist pattern 3 is more chemically modified than the other area is not clear, it is guessed to be one of the reasons that an intermixing between a surface area of the resist pattern 3 and the neighboring area to the resist pattern 3 in the coated layer 4 is taken place by heating, however the present invention being not limited by this reason. Furthermore, the coated layer 4 where the modified layer 5 which is made insoluble in the developer is developed to form a pattern having the modified layer 5 on a surface of the resist pattern 3 (see FIG. 1(e)).

As described above, by forming the modified layer 5 described above on the surface (upper face and side face) of the resist pattern, the breadth between a resist pattern and a neighboring resist pattern is narrowed to make it possible to reduce a separation size or a hole aperture size of a resist pattern practically and effectively below a limit resolution. As the modified layer described above can play a role of a protecting layer against an electron beam, it is possible to restrain a size measurement fluctuation of a resist pattern by irradiation of an electron beam of a size measuring SEM. Accordingly it is possible to restrain a dimensional fluctuation of a resist pattern as well as to conduct a size measurement of a resist pattern in a size measurement inspection of a resist pattern by a size measuring SEM.

The radiation sensitive resin composition which is applicable to form the resist pattern 3 described above may be any radiation sensitive resin compositions so far publicly known and publicly applied. As a radiation sensitive resin composition, there can be raised a positive-working resist comprising an alkali-soluble resin such as novolak resin, a hydroxystyrene type resin or an acrylic resin and a quinone diazide compound, a chemically amplified positive or negative-working resist wherein an acid is generated by irradiation of light and a resist pattern is formed by a catalytic action of the generated acid, and so on. Of these radiation sensitive resin composition, a chemically amplified positive-working resist wherein an acid is generated by irradiation of light and a resist pattern is formed by a catalytic action of the generated acid is preferred. In the high water repellent resist pattern formed from, for example, an ArF resist, it was so far difficult to form a crosslinked film of a water-soluble resin having sufficient film thickness on the resist pattern by forming a coating layer of a water-soluble resin to be crosslinked by an acid on the resist pattern and to crosslink the coating layer of the water-soluble resin by diffusion of an acid from the resist pattern. Referring to the fact, as a radiation sensitive resin composition to which the water-soluble resin composition of the present invention is applied, the radiation sensitive resin composition with a relatively highly water-repellant, for example, ArF resist is preferred in the present invention. In addition, it is known that a size measurement fluctuation of a resist pattern is taken place with the resist pattern formed by an ArF resist upon inspection by a size measuring SEM as already mentioned, and it is preferred that a radiation sensitive resin composition is an ArF resist from the view point to prevent it. Although many ArF resists have been being proposed and come onto the market, any of those publicly known and publicly applied ArF resists can be used. In addition, a resist pattern forming method using a radiation sensitive resin composition maybe any methods so far known including an application method, a light-exposure method, a baking method, a developing method, a rinsing method and so on.

As a method applying the radiation sensitive resin composition which is a coated layer forming material of the present invention, there may be utilized a proper method such as a spin coating method, a spray coating method, a dipping application method, or a roller coating method which has so far been known. After being applied, the coated layer forming material is prebaked if necessary to make the coated layer 4. The conditions of heat treatment for the coated layer are a heating temperature of approximately 70 to 160° C. and a heating time of approximately 60 to 120 seconds, preferably for 50 to 80 seconds. The heating temperature is preferably the temperature that an intermixing between a resist pattern and a coated layer is taken place. The film thickness of a modified layer to be formed can be adjusted properly by temperature and time of heat treatment, a radiation sensitive resin composition to be used, a water-soluble resin composition to be used, and so on. Therefore these conditions may be set up depending on how much it is necessary to thicken a resist pattern. In the case that a modified layer is formed on a photoresist in order to reduce the fluctuation of a size measurement value of the photoresist against electron beam irradiation of a size measuring SEM upon size-measuring a resist pattern, the breadth (film thickness) of a modified layer is preferably made to be 2 to 100 nm.

Furthermore, as a developing agent that is applied for leaving the modified layer 5 which is formed by heating and removing unmodified coated layer, water, a mixed solution of water and a water-soluble organic solvent, an aqueous alkali solution such as TMAH (tetramethylammonium hydroxide) and so on are applied.

BEST MODE FOR PRACTICING THE INVENTION

The present invention will now be described more specifically by reference to Examples which, however, are not to be construed to limit the present invention in any way.

EXAMPLE 1

Preparation of a Water-soluble Resin Composition A

| | |
|---|---|
| Polyvinylpyrrolidone-co-polyvinylacetate | 9.2 parts by weight |
| triethylamine salt of paratoluene sulfonic acid and | 0.8 parts by weight |
| pure water | 90.0 parts by weight | were mixed and then stirred sufficiently to solve. Thereafter the solution was filtrated with a 0.2-μm filter to prepare a water-soluble resin composition A.

EXAMPLE 2

Preparation of a Water-soluble Resin Composition B

| | |
|---|---|
| Polyvinylpyrrolidone-co-polyvinylimidazole | 4.5 parts by weight |
| polyvinylpyrrolidone | 0.8 parts by weight |
| triethylamine salt of paratoluene sulfonic acid | 0.9 parts by weight |
| surfactant (Acetylenol EL manufactured by Kawaken Chemical company) and | 0.002 parts by weight |
| pure water | 93.8 parts by weight | were mixed and then stirred sufficiently to solve. Thereafter the solution was filtrated with a 0.2-μm filter to prepare a water-soluble resin composition B.

EXAMPLE 3

Formation of a Contact Hole Pattern

A positive-working photosensitive resin composition, AZ AX1050P-HS manufactured by Clariant Corporation ('AZ' is a trademark.) was applied on a silicon wafer of 6 inch in diameter treated with HMDS (hexamethyldisilazane) by a spin coater MK-8 manufactured by Tokyo Electron Co., Limited and pre-baked at 115° C. for 60 seconds on a hotplate to prepare a resist film of approximately 0.40 μm in thickness. Next, the resist film was exposed to light through a pattern, in which hole patterns having various kind of diameter sizes exist, by use of a light-exposure device PAS5500/950 manufactured by ASML Company with an exposure wavelength of ArF excimer laser (193 nm) and a post-exposure-bake (PEB) was conducted at 110° C. for 60 seconds on a hot plate. Thereafter the resist film was spray-paddle developed under the condition at 23° C. for one minute using alkali developing agent AZ 300MIF Developer (a 2.38% by weight an aqueous solution of tetramethylammonium hydroxide) manufactured by Clariant (Japan) K.K. to obtain a positive resist pattern.

Formation of a Pattern Having a Modified Layer

The water-soluble resin composition A was applied on the thus-obtained hole pattern by a spin coater MK-8 manufactured by Tokyo Electron Co., Limited and baked on a hotplate at 85° C. for 70 seconds to prepare so as to obtain a water-soluble resin film of approximately 0.35 μm in thickness. Furthermore, a mixing bake was conducted on a hotplate at 110° C. for 90 seconds and a development treatment with pure water was conducted under the condition at 23° C. for 1 minute to obtain a water insoluble modified layer of a water-soluble resin film on the contact hole pattern. Furthermore, baking treatment for drying was conducted on a hotplate at 110° C. for 70 seconds. Thereby was obtained a hole pattern, the hole diameter of which was reduced.

Evaluation of a Formation Capability of a Water Insoluble Modified Layer

Hole diameter sizes of hole patterns before and after a formation of a water insoluble modified layer were measured by the high accuracy external appearance dimension evaluation device S-9200 manufactured by Hitachi Co., Limited, and a fluctuation of a size measurement value at this time was observed. A dimension reduction ratio was obtained according to the Formula 1 described below and a formation capability of a water insoluble modified layer of a water-soluble resin composition was evaluated with the calculated values of a dimension reduction ratio. The result was shown in the Table 1 described below.

Dimension reduction ratio (%)={[(dimension before formation of an insoluble modified layer)−(dimension after formation of an insoluble modified layer)]/(dimension before formation of an insoluble modified layer)}×100 [Formula 1]

EXAMPLE 4

The same procedure as in example 3 was carried out except for using a water-soluble resin composition B instead of a water-soluble resin composition A to obtain a size-reduced hole pattern with a water insoluble modified layer, and the dimension reduction ratio of the formed hole pattern was calculated as in example 3. The result is shown in Table-1 described below.

Comparative Example 1

The same procedure as in example 3 was carried out except for using a water-soluble resin composition AZ R500 for forming a coated layer manufactured by Clariant (Japan) K.K. (AZ R500 dose not contain an acid generating agent.) instead of a water-soluble resin composition A to produce a hole pattern with a water insoluble modified layer, and the dimension reduction ratio of the formed hole pattern was calculated as in example 3. The result is shown in Table-1 described below.

TABLE 1

|  | Water-soluble resin composition | Reduction ratio | |
| --- | --- | --- | --- |
| Example 3 | A | 21.8 | 19.0 |
| Example 4 | B | 10.5 | 11.4 |
| Comparative Example 1 | AZ R500 | 2.5 | 4.0 |

Reference Example 1

A positive-working photosensitive resin composition, AZ DX5240P manufactured by Clariant (Japan) K.K. was applied on a silicon wafer of 6 inch in diameter treated with HMDS by a spin coater MK-8 manufactured by Tokyo Electron Co., Limited and pre-baked at 90° C. for 60 seconds on a hotplate to prepare a resist film of approximately 0.54 µm in thickness. Next, the resist film was exposed to light through a pattern, in which hole patterns having various kind of diameter sizes exist, by use of a light-exposure device FPA300 EX5 (NA=0.63) manufactured by Canon company having an exposure wavelength of KrF excimer laser (248 nm) and a post-exposure-bake (PEB) was conducted on a hot plate at 110° C. for 60 seconds. Thereafter the resist film was spray-paddle developed under the condition at 23° C. for one minute using an alkali developing agent AZ 300MIF Developer (a 2.38% by weight aqueous solution of tetramethylammonium hydroxide) manufactured by Clariant (Japan) K.K. under the condition at 23° C. for one minute to obtain a positive resist pattern and to make it a matrix for inspection of a size measurement fluctuation (reference).

EXAMPLE 5

Figure 2:
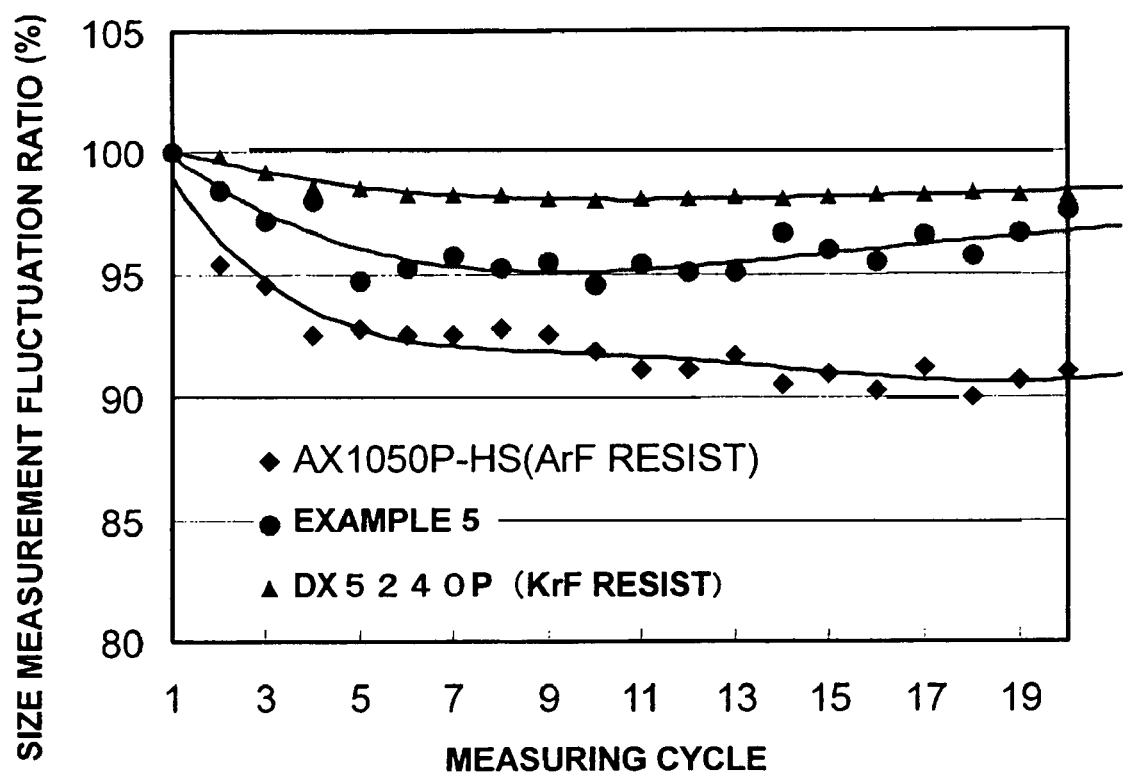
FIG. 2 shows a graph showing a size measurement fluctuation ratio of a resist pattern.

A matrix having the modified layer of the water-soluble resin composition B on the surface of ArF resist AX1050P obtained by the same procedure as in Example 3 was used as a matrix for an inspection of a size measurement fluctuation. Hole diameters of hole patterns on the matrix were measured in a plural number of times at the same point as follows, and size measurement fluctuation ratios were calculated according to the Formula 2 at each time. The result is shown in FIG. 2 (black spot (●) in FIG. 2).

By the way when measuring the modified layer of the matrix used in the present Example, thickening of 22.8 nm in an effective size was observed.

Measurement Method of a Hole Diameter

By the evaluation device for a high accuracy external appearance dimension, S-9200 manufactured by Hitachi Co., Limited, an auto-focus and a size measurement were conducted at 600V of accelerating voltage, 8.0 pA of beam electric stream, 100,000 times of a magnification, 35% threshold of a size measuring method and 64 times of image overlapping times at one point for 1 point and 1 set.

Size measurement fluctuation ratio (%)=[(size measurement value at the time)/(size measurement value at first time)]×100 [Formula 2]

Reference Example 2 and Comparative Example 2

By use of the matrix for an inspection of a size measurement prepared in Reference Example 1 as a matrix for a measurement for a reference and a matrix having an ArF resist pattern before being coated with a coated layer, which was prepared in the same procedure as in Example 3, as a matrix for an inspection of a size measurement in the Comparative Example, a plural number of hole size measurements at the same point were conducted with the same procedure as in Example 5, and then the fluctuation ratio at each time was calculated. The results are shown in FIG. 2. In FIG. 2, ▲ shows the result of Reference Example 2 and ♦ shows the result of Comparative Example 2.

As is clear from FIG. 2, a size measurement fluctuation of a resist pattern upon measuring a size of the resist pattern by a size measuring SEM is hardly taken place in the case of KrF resist from the result of Reference Example 2, however ArF resist single layer causes a big size measurement fluctuation as shown by Comparative Example 2. Whereas the fluctuation ratio can be improved by forming the modified layer on a surface of an ArF resist pattern using the water-soluble resin composition of the present invention as shown in Example 5 (FIG. 2 to be referred).

EFFECT OF THE INVENTION

As mentioned above in detail, it becomes possible to apply a water-soluble resin composition well onto the resist pattern having a high water repellency such as an ArF resist pattern on which it was difficult to apply uniformly the water-soluble resin composition in the method so far applied and was difficult to form an acid-crosslinked hard layer having sufficient thickness and also it is possible to form a modified layer having sufficient film thickness in a good controllability by applying the water-soluble resin composition of the present invention as materials for forming a coated layer of a resist pattern. Thereby it is possible to reduce a separation size or a hole aperture size of a resist pattern easily and effectively below a limit resolution by thickening a resist pattern which is high in water repellency such as an ArF resist pattern with the water-soluble resin composition. Accordingly it is possible to form easily and at small cost a fine trench pattern or a fine hole pattern having a breadth below a resist limit resolution by the present invention.

And also for an ArF resist pattern which has a high fluctuation of a size measurement ratio and has a problem in a size measurement inspection affected by an electron beam upon measuring a size of a resist pattern by SEM, it becomes possible to moderate an influence on a resist pattern by irradiation of electron beam by forming a developing agent insoluble modified layer on a surface of a resist pattern applying the water-soluble resin composition of the present invention to improve a size measurement fluctuation ratio of an ArF resist pattern. Therefore it is possible to ensure the retention of quality upon manufacturing a semiconductor device easily and to be able to manufacture a semiconductor integrated circuit and so on in a high yield.

What is claimed is:

1. A water-soluble resin composition comprising at least a water-soluble resin; an acid generator capable of generating an acid by heating and a solvent containing water, wherein the water-soluble resin is a copolymer represented by the general formula (I):

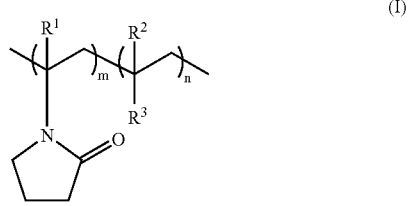

(I)

wherein $R^1$ and $R^2$ each represent independently a hydrogen atom or a methyl group, and $R^3$ represents

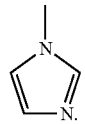

2. The water-soluble resin composition according to claim 1, wherein the solvent containing water is water.

3. The water-soluble resin composition according to claim 1, wherein the solvent containing water comprises water and a water-soluble organic solvent.

4. The water-soluble resin composition according claim 1, wherein the acid generator is an amine salt of an organic acid represented by the general formula (III):

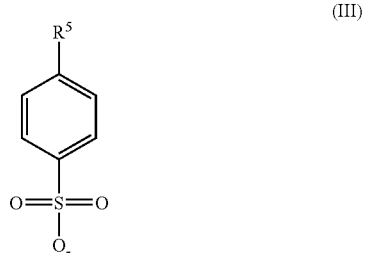

(III)

-continued

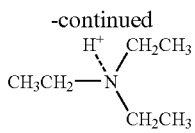

wherein $R^5$ represents an alkyl group, a hydroxyl group or a carboxyl group.

5. The water-soluble resin composition according to claim 1, wherein the water-soluble resin composition further comprises a surface active agent.

6. The water-soluble resin composition according to claim 1, which comprises 1 to 30 parts by weight of the water-soluble resin and 0.01 to 10 parts by weight of the acid generator relative to 100 parts by weight of the water-soluble resin composition.

7. A pattern forming method which reduces a separation size or a hole aperture size of a resist pattern comprising a step of forming a coated layer by applying the water-soluble resin composition according to claim 1 on a resist pattern, a step of forming a modified layer of the coated layer which is made insoluble in a developer in a determined width on a surface of the resist pattern by heating the coated layer, and a step of forming a pattern having the modified layer on a surface of the resist pattern by developing the coated layer.

8. The pattern forming method according to claim 7 characterized in that the resist pattern is a resist pattern which is formed by an ArF responsive radiation sensitive resin composition.

9. A method which reduces a dimensional fluctuation of a resist pattern by electron beam irradiation, comprising a step of forming a coated layer by applying the Water-soluble resin composition according to claim 1 on a resist pattern, a step of forming a modified layer of the coated layer which is made insoluble in a developer in a determined width on a surface of the resist pattern by heating the coated layer, and a step of forming a pattern having the modified layer on a surface of the resist pattern by developing the coated layer.

10. The method which reduces a dimensional fluctuation of a resist pattern by electron beam irradiation according to claim 9 characterized in that the resist pattern is a resist pattern which is formed by an ArF responsive radiation sensitive resin composition.

11. A method of a resist pattern inspection comprising a step of forming a coated layer by applying the water-soluble resin composition according to claim 1 on a resist pattern, a step of forming a modified layer of the coated layer which is made insoluble in a developer in a determined width on a surface of the resist pattern by heating the coated layer, a step of forming a pattern having the modified layer on a surface of the resist pattern by developing the coated layer, and a step of measuring a resist pattern size by electron beam irradiation to the resist pattern.

12. The method of a resist pattern inspection according to claim 11 characterized in that the resist pattern is a resist pattern which is formed by an ArF responsive radiation sensitive resin composition.

13. The method of a resist pattern inspection according to claim 11 characterized in that the film thickness of the modified layer is 2 to 100 nm.

* * * * *